US008632884B2

(12) United States Patent
Ying et al.

(10) Patent No.: US 8,632,884 B2
(45) Date of Patent: Jan. 21, 2014

(54) NANOCOMPOSITES

(75) Inventors: Jackie Y. Ying, Singapore (SG); Jun Yang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 60 days.

(21) Appl. No.: 13/057,395

(22) PCT Filed: Aug. 6, 2008

(86) PCT No.: PCT/SG2008/000289
§ 371 (c)(1),
(2), (4) Date: Aug. 8, 2011

(87) PCT Pub. No.: WO2010/016798
PCT Pub. Date: Feb. 11, 2010

(65) Prior Publication Data
US 2011/0287259 A1     Nov. 24, 2011

(51) Int. Cl.
*B32B 5/16* (2006.01)
(52) U.S. Cl.
USPC .......................................... 428/403; 427/212
(58) Field of Classification Search
USPC .......................................... 428/403; 427/212
See application file for complete search history.

(56) References Cited

U.S. PATENT DOCUMENTS

| | | | |
|---|---|---|---|
| 6,660,058 B1 * | 12/2003 | Oh et al. | 75/351 |
| 7,060,121 B2 | 6/2006 | Lin et al. | |
| 7,193,098 B1 | 3/2007 | Lucey et al. | |
| 7,288,134 B2 | 10/2007 | Sun et al. | |
| 7,507,530 B2 | 3/2009 | Huang et al. | |
| 2004/0261574 A1 | 12/2004 | Lin et al. | |
| 2005/0208142 A1 | 9/2005 | Zheng et al. | |
| 2006/0065075 A1 * | 3/2006 | Chang et al. | 75/371 |
| 2006/0073667 A1 * | 4/2006 | Li et al. | 438/311 |
| 2006/0254387 A1 * | 11/2006 | Lee et al. | 75/252 |
| 2007/0128439 A1 | 6/2007 | Kim et al. | |
| 2008/0128761 A1 | 6/2008 | Banin et al. | |

FOREIGN PATENT DOCUMENTS

| | | | |
|---|---|---|---|
| CN | 101195172 | * | 6/2008 |
| CN | 101195172 A | | 6/2008 |
| JP | H05-501928 A | | 4/1993 |
| JP | 2007/046162 A | | 2/2007 |
| WO | WO91/06036 | * | 5/1991 |
| WO | WO 91/06036 A1 | | 5/1991 |
| WO | WO02/096262 | * | 12/2002 |
| WO | WO02/96262 | * | 12/2002 |
| WO | WO 02/096262 A2 | | 12/2002 |
| WO | WO2007/103536 | * | 9/2007 |
| WO | WO 2007/103536 A2 | | 9/2007 |
| WO | WO2008/018718 | * | 2/2008 |
| WO | WO 2008/018718 A1 | | 2/2008 |

OTHER PUBLICATIONS

Mingzhao Liu et al: "Preparation and optical properties of silver chalcogenide coated gold nanorods" Journal of Materials Chemistry vol. 16, No. 40 , Jan. 1, 2006.*
Taleb Mokari et al: "Formation of asymmetric one-sided metal-tipped semiconductor nanocrystal dots and rods", Nature Materials, vol. 4, No. 11, Nov. 1, 2005.*
Kvonoho Jang et al: "Shape-controlled synthesis of silver sulfide nanocrystals. . . ", Chemical Communications, No. 43 Jan. 1, 2007.*
Wenjing Lou et al: "A simple route to synthesize size-controlled Ag2S core/shell nanocrystals and their self assembly", Nanotechnology, IOP, Bristol, GB, vol. 19, No. 22, Jun. 4, 2008.*
PCT International Search Report and Written Opinion, PCT Application No. PCT/SG2008/000289, Nov. 21, 2008, 12 pages.
PCT International Preliminary Report on Patentability, PCT Application No. PCT/SG2008/000289, May 3, 2010, 6 pages.
Chen, M. et al., "Preparation and Characterization of Metal Sulfides in Ethylenediamine under Ambient Conditions through a γ-Irradiation Route," Journal of Colloid and Interface Science, May 2001, pp. 47-53, vol. 237, Issue 1.
European Extended Search Report, European Patent Application No. 08794194.4, Aug. 9, 2012, 8 pages.
Japanese Office Action, Japanese Application No. 2011-522027, May 1, 2013, 2 pages.
Jang, K. et al., "Shape-Controlled Synthesis of Silver Sulfide Nanocrystals by Understanding the Origin of Mixed-Shape Evolution," Chemical Communications, 2007, pp. 4474-4476.
Liu, M. et al., "Preparation and Optical Properties of Silver Chalgenide Coated Gold Nanorods," Journal of Materials Chemistry, 2006, pp. 3942-3945, vol. 16, No. 40.
Lou, W. et al., "A Simple Route to Synthesize Size-Controlled Ag2S Core-Shell Nanocrystals, and Their Self-Assembly," Nanotechnology, Jun. 4, 2008, pp. 1-8, vol. 19.
Mokari, T. et al., "Diffusion of Gold into InAs Nanocrystals," Agnew. Chem. Int. Ed. 2006, pp. 8001-8005, vol. 45.
Mokari, T. et al., "Formation of Asymmetric One-Sided Metal-Tipped Semiconductor Nanocrystal Dots and Rods," Nature Materials, Nov. 2005, pp. 855-863, vol. 4.
Mokari, T. et al., "Selective Growth of Metal Tips Onto Semiconductor Quantum Rods and Tetrapods," Science, Jun. 18, 2004, pp. 1787-1790, vol. 304.
Ye, Y. et al., "Synthesis of Ag$_2$S Nanoparticles at Room Temperature and Their Characterization with XPS," Spectroscopy and Spectral Analysis, Apr. 2005, pp. 553-555, vol. 25, No. 4 (with English abstract).

(Continued)

*Primary Examiner* — Leszek Kiliman
(74) *Attorney, Agent, or Firm* — Fenwick & West LLP

(57) ABSTRACT

The invention describes a nanocomposite particle comprising a nanoparticle having a surface comprising a silver salt, and at least one region of metallic gold on said surface. The invention also provides a nanocomposite material comprising said particles and processes for making the nanocomposite material, either by allowing gold in nanoparticles having a silver salt on the surface thereof to at least partially diffuse through the silver salt so as to form at least one region of metallic gold on said surface, or else by depositing metallic gold on the surfaces of nanoparticles having the silver salt on the surface thereof.

21 Claims, 8 Drawing Sheets

(56) References Cited

OTHER PUBLICATIONS

Wang, X. et al., "A Simple Large-Scale Synthesis of Well-Defined Silver Sulphide Semiconductor Nanoparticles with Adjustable Sizes," Chemistry Letters, 2005, pp. 1664-1665, vol. 34.

Yang, J. et al., "Core-Shell Ag-Au Nanoparticles from Replacement Reaction in Organic Medium," The Journal of Physical Chemistry B, Oct. 2005, pp. 19208-19212, vol. 109, No. 41.

Yang, J. et al., "Heterogeneous Deposition of Noble Metals on Semiconductor Nanoparticles in Organic or Aqueous Solvents," Journal of Material Chemistry, 2006, pp. 4025-4028, Issue 16.

Yin, Y. et al., "Formation of Hollow Nanocrystals Through the Nanoscale Kirkendall Effect," Science, Apr. 30, 2004, pp. 711-714, vol. 304.

Zhuang, Z. et al., "Tetrahedral Colloidal Crystals of $Ag_2S$ Nanocrystals," Agnew. Chem. Int. Ed., 2007, pp. 8174-8177, vol. 46.

\* cited by examiner

NANOCOMPOSITES

TECHNICAL FIELD

The present invention relates to nanocomposites and to methods of making them.

BACKGROUND OF THE INVENTION

The synthesis of a multifunctional nanocomposite system is of great interest. In particular, a heterodimer consisting of a noble metal and a semiconductor would be very useful for a variety of applications. Growth of Au tips on the apexes of semiconductor CdSe rods has recently been reported. Methods also exist to grow a gold tip on CdSe dot and rod. For these structures, the mechanism of growth was explained by Ostwald ripening. An approach was also developed to heterogeneously deposit gold on spherical lead sulfide quantum dots (QDs) in organic or aqueous medium, producing materials suitable for biological applications. Despite these strategies, difficulties have been encountered in specific systems such as the gold-silver sulfide system.

OBJECT OF THE INVENTION

It is the object of the present invention to substantially overcome or at least ameliorate one or more of the above difficulties.

SUMMARY OF THE INVENTION

In a first aspect of the invention there is provided a nanocomposite particle comprising:
  a nanoparticle having a surface comprising a silver salt, and
  at least one region of metallic gold on said surface.

The following options may be used in conjunction with the first aspect, either individually or in any suitable combination.

The nanoparticle may consist essentially of the silver salt. The nanoparticle may have a core-shell structure (i.e. may comprise a core and a shell surrounding said core), wherein the shell (or, in the case of a nanoparticle having more than one shell, the outermost shell) consists essentially of the silver salt.

The silver salt may be capable of catalysing deposition of metallic gold on the surface thereof. It may be capable of catalysing the reduction of a gold salt (e.g. an Au(III) salt) to produce metallic gold. It may be a silver chalcogenide. The chalcogenide may be sulfide, selenide or telluride. The silver salt may be silver sulfide. It may be silver selenide. It may be silver telluride. It may be a mixture of any two or more of these.

The nanoparticle may be substantially spherical. The nanocomposite particle may be substantially spherical.

The region(s) of metallic gold may be approximately circular. The region of metallic gold, or each region of metallic gold independently, may have a diameter of about 1 to about 8 nm.

In an embodiment there is provided a nanocomposite particle comprising:
  a substantially spherical nanoparticle having a surface comprising silver sulfide, and
  an approximately circular region of metallic gold on said surface.

In another embodiment there is provided a nanocomposite particle comprising:
  a substantially spherical nanoparticle, said nanoparticle having a core-shell structure, wherein the shell consists essentially of silver sulfide, and
  an approximately circular region of metallic gold on said shell.

In a second aspect of the invention there is provided a nanocomposite material comprising a plurality of nanocomposite particles, each of said nanocomposite particles being according to the first aspect.

The nanocomposite material may consist essentially of said nanocomposite particles. The nanocomposite particles may have a mean diameter of about 5 to about 25 nm. They may be substantially monodispersed. They may have a narrow particle size distribution.

In a third aspect of the invention there is provided a process for making a nanocomposite material, said process comprising:
  providing a plurality of precursor nanoparticles, each having a surface comprising metallic gold;
  forming a layer of a silver salt on the gold thereby forming coated nanoparticles; and
  aging the coated nanoparticles so as to allow the gold of each coated nanoparticle to at least partially diffuse through the layer of the silver salt to the surface of said coated nanoparticle so as to form at least one region of metallic gold on said surface.

The following options may be used in conjunction with the third aspect, either individually or in any suitable combination.

The precursor nanoparticles may consist essentially of metallic gold. The step of providing the precursor nanoparticles may comprise the step exposing an Au(III) salt to a reducing agent so as to form the nanoparticles. The reducing agent may be borohydride or some other reducing agent. The process may also comprise the step of transferring the gold precursor nanoparticles into an organic solvent prior to the step of forming the layer of the silver salt on the gold.

The precursor nanoparticles may each comprise a core having the gold on a surface thereof. The core may comprise a material that is not gold. The step of providing the precursor nanoparticles may comprise heating the cores in the presence of Au(III) and an amine so as to deposit metallic gold on the surfaces of the cores. The cores may comprise, or may consist essentially of, metallic platinum, optionally together with a trace amount of silver. The process may comprise the step of heating Pt(acac)$_2$ in the presence of an amine and of a trace amount of silver so as to produce the cores.

The silver salt may be silver sulfide. The step of forming the layer of the silver sulfide may comprise exposing the precursor nanoparticles to Ag(I) and elemental sulfur. The exposing may be in the presence of an alkyl amine. It may be conducted in an organic solvent.

The step of aging may comprise maintaining the coated nanoparticles in a solvent, e.g. an organic solvent, for sufficient time for the gold of each coated nanoparticle to diffuse through layer of the silver salt to the surface of said coated nanoparticle.

The precursor nanoparticles may have a mean diameter of about 3 to about 25 nm. They may be substantially monodispersed. They may have a narrow particle size distribution.

In an embodiment there is provided a process for making a nanocomposite material, said process comprising:
  reducing an Au(III) salt with a reducing agent so as to form a plurality of gold precursor nanoparticles;
  transferring the gold precursor nanoparticles into an organic solvent;
  forming a layer of silver sulfide on the gold thereby forming coated nanoparticles; and
  aging the coated nanoparticles so as to allow the gold of each coated nanoparticle to at least partially diffuse through the layer of silver sulfide to the surface of said coated nanoparticle so as to form at least one region of metallic gold on said surface.

In another embodiment there is provided a process for making a nanocomposite material, said process comprising:
  heating a plurality of platinum cores in the presence of Au(III) and an amine so as to deposit metallic gold on the surfaces of the cores, thereby producing a plurality of core-shell precursor nanoparticles, each having a surface comprising metallic gold;
  forming a layer of silver sulfide on the gold thereby forming coated nanoparticles; and
  aging the coated nanoparticles so as to allow the gold of each coated nanoparticle to at least partially diffuse through the layer of silver sulfide to the surface of said coated nanoparticle so as to form at least one region of metallic gold on said surface.

In another embodiment there is provided a process for making a nanocomposite material, said process comprising:
  heating $Pt(acac)_2$ in the presence of an amine and of a trace amount of silver so as to produce a plurality of cores;
  heating the cores in the presence of Au(III) and an amine so as to deposit metallic gold on the surfaces of the cores, thereby producing a plurality of core-shell precursor nanoparticles each having a surface comprising metallic gold;
  forming a layer of silver sulfide on the gold, thereby forming coated nanoparticles; and
  aging the coated nanoparticles so as to allow the gold of each coated nanoparticle to at least partially diffuse through the layer of silver sulfide to the surface of said coated nanoparticle so as to form at least one region of metallic gold on said surface.

In a fourth aspect of the invention there is provided a process for making a nanocomposite material, said process comprising:
  providing a plurality of nanoparticles, each having a surface comprising a silver salt; and
  depositing metallic gold on the surfaces of said nanoparticles.

The following options may be used in conjunction with the fourth aspect, either individually or in any suitable combination.

The silver salt may be silver sulfide. The step of providing the nanoparticles may comprise reacting an Ag(I) salt with elemental sulfur so as to form the nanoparticles. The exposing may be in the presence of an amine. The nanoparticles may be provided in an organic solvent. They may be produced in the organic solvent.

The step of depositing metallic gold may comprise exposing the nanoparticles to a solution of Au(III) in the presence of an amine. This step may be conducted in an organic solvent.

In an embodiment there is provided a process for forming a making a nanocomposite material, said process comprising:
  reacting an Ag(I) salt with elemental sulfur so as to form a plurality of nanoparticles, each having a surface comprising silver sulfide; and
  exposing the nanoparticles to a solution of Au(III) in the presence of an amine so as to deposit metallic gold on the surfaces of said nanoparticles.

The invention also provides a nanocomposite material made by the process of either the third or the fourth aspect of the invention.

In a fifth aspect of the invention there is provided use of a nanocomposite material comprising nanocomposite particles according to the first aspect, or of a nanocomposite material according to the second aspect, or of a nanocomposite material made by the process of the third or the fourth aspect, as a catalyst, or for making an optical or an electronic device.

In a sixth aspect of the invention there is provided a process for producing nanoparticles of a silver compound comprising:
  providing an aqueous solution comprising a silver salt and an alkyl amine;
  extracting the silver salt into an organic solvent to form an organic solution comprising silver ions; and
  precipitation of the silver ions in the organic solution as nanoparticles of the silver compound.

The following options may be used in conjunction with the sixth aspect, either individually or in any suitable combination.

The aqueous solution may comprise an alcohol. It may comprise a water miscible alcohol, e.g. ethanol. The step of providing the aqueous solution may comprise combining a solution of the silver salt in water with a solution of the alkyl amine in the alcohol.

The alkyl amine may be a primary alkyl amine. It may be a long chain alkyl amine. It may be a C8 to C18 alkyl amine e.g. dodecylamine or a mixture of C8 to C18 alkyl amines.

The silver salt may be silver nitrate.

The organic solvent may have low miscibility with water. It may be a hydrocarbon solvent. It may be an aromatic solvent. It may for example be benzene, toluene or xylene. It may be a mixture of individual solvents.

The silver compound may be silver sulfide. In this case the step of precipitation may comprise exposing the organic solution to elemental sulfur. This may comprise combining the organic solution with an organic solution of the sulfur. The solvent for the organic solution of sulfur may be miscible with the organic solvent of the organic solution. It may be the same as or may be different to the organic solvent of the organic solution.

The silver compound may precipitate as a suspension or a dispersion. The dispersion or suspension may be stable.

The process may be conducted at room temperature. It may be conducted at about 15 to about 25° C.

The step of extracting may result in at least about 95% transfer of silver ions from the aqueous solution.

BRIEF DESCRIPTION OF THE DRAWINGS

A preferred embodiment of the present invention will now be described, by way of an example only, with reference to the accompanying drawings as described below.

DETAILED DESCRIPTION OF THE INVENTION

Figure 1:
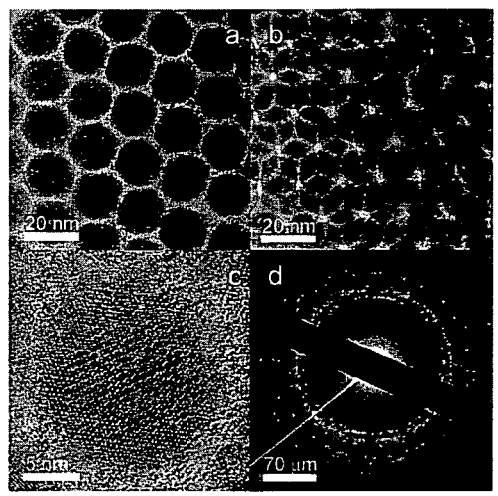
FIG. 1 shows (a, b) TEM images, (c) HRTEM image, and (d) SAED pattern of the $Ag_2S$ nanocrystals.

In the present specification the terminology A@B indicates a core-shell structure in which the core consists essentially of A and the shell consists essentially of B. Consequently the terminology A@B@C indicates a core-shell-shell structure in which a core consisting essentially of A is surrounded by a shell consisting essentially of B, which is in turn surrounded by a further shell consisting essentially of C.

The present invention provides a nanocomposite particle comprising a nanoparticle having a surface comprising a silver salt, and at least one region of metallic gold on said surface. The nanoparticle and the nanocomposite particle may each, independently, have a diameter of about 5 to about 25 nm or about 5 to 20, 5 to 15, 10 to 25, 15 to 25 or 10 to 20 nm, e.g. about 5, 10, 15, 20 or 25 nm, provided that the diameter of the nanoparticle is less than or equal to that of the nanocomposite particle. The nanoparticle and the nanocomposite particle may, independently, be spherical, approximately spherical, oblate spherical, ovoid, polyhedral or some other shape. There may be one region of metallic gold, or there may be more than one such region, e.g. 2, 3, 4 or 5 regions. The region, or each region independently, may be round, oval, polygonal or irregular, or some other shape. It (they independently) may be about 1 to about 8 nm in diameter, or about 1 to 5, 1 to 3, 3 to 8, 5 to 8 or 2 to 6 nm, e.g. about 1, 2, 3, 4, 5, 6, 7 or 8 nm in diameter. The diameter of the, or each, region should be smaller than that of the nanoparticle. In some embodiments the nanoparticle is completely coated in the gold (i.e. the entire surface of the nanocomposite particle consists of gold), whereas in other particles the nanocomposite particle has regions of its surface that comprise the silver salt (i.e. only a portion of the surface of the nanocomposite particle consists of gold). The thickness of the region(s) of gold may be less than about 2 nm, or less than 1, 0.5 or 0.2 nm, or may be about 0.1, 0.2, 0.3, 0.4, 0.5, 0.6, 0.7, 0.8, 0.9, 1, 1.5 or 2 nm thick. It may be about 1 to 20 atoms thick, or 1 to 10, 1 to 5, 5 to 20, 10 to 20 or 5 to 10 atoms thick, e.g. about 1, 2, 5, 10, 15 or 20 atoms thick, or may be more than 20 atoms thick, e.g. about 25, 30, 35, 40, 45 or 50 atoms thick. The gold may be at least about 90% pure (on a mole basis) or at least about 95, 99, 99.5 or 99.9% pure.

In some embodiments the nanoparticle consists essentially of the silver salt. The silver salt may be at least about 90% pure on a mole basis, or at least about 95 or 99% pure. It may consist essentially of a mixture of silver salts, in which case at least about 90% (or at least about 95 or 99%) of the metal content of the mixture may be silver on a mole basis. The silver salt may have low or negligible water solubility. It may have low or negligible solubility in organic solvents, particularly in the organic solvent(s) (e.g. toluene) used in making it or in using it to make the nanocomposite particles.

In some embodiments the nanoparticle has a core-shell structure. In this case the shell may consist essentially of, or may comprise, the silver salt. The core may have a diameter of about 1 to about 10 nm, or about 1 to 5, 5 to 10, 2 to 10, 2 to 5 or 3 to 5 nm, e.g. about 1, 2, 3, 4, 5, 6, 7, 8, 9 or 10 nm. It may comprise, or consist essentially of, metallic platinum or metallic palladium or a mixture of these. Thus the nanoparticle may be a Pt@$Ag_2S$ nanoparticle. A plurality of the cores (used for making a nanocomposite material as described herein) may have a mean particle diameter as described above for the particle diameter. The cores may have a narrow particle size distribution. They may be substantially monodispersed. The shell of the core shell particle may be about 1 to about 10 nm in thickness, or about 1 to 5, 1 to 2, 2 to 10, 5 to 10, 2 to 8 or 2 to 5 nm, e.g. about 1, 2, 3, 4, 5, 6, 7, 8, 9 or 10 nm. In the case of a plurality of cores, these may be mean values.

The inventors have found that metallic gold (Au(0)) is capable of diffusing through a layer of a silver salt to a surface thereof. They have used this surprising phenomenon in order to make a nanocomposite material comprising nanocomposite particles as described above. The process comprises forming a layer of a silver salt on the surfaces of a plurality of precursor nanoparticles, said surfaces comprising metallic gold. Aging of the resulting coated nanoparticles allows the gold to at least partially diffuse through the layer of the silver salt to the surface of said coated nanoparticle so as to form one or more regions of metallic gold on the surfaces. The inventors have further found that an Ostwald ripening phenomenon occurs such that larger regions of gold on the surface of a nanoparticle can grow over time at the expense of smaller regions. Ultimately this may lead to a nanocomposite particle having only a single gold region on the surface. However prior to this ripening reaching this ultimate state, more than one gold region may be present on the surface, and these may have different sizes or may be approximately the same size. Different nanocomposite particles in a nanocomposite material may have different numbers and/or sizes of regions of gold on their surfaces.

The precursor nanoparticles used in making the nanocomposite material may have a mean diameter of about 3 to about 25 nm or about 3 to 15, 3 to 10, 3 to 5, 5 to 25, 5 to 20, 5 to 15, 10 to 25, 15 to 25 or 10 to 20 nm, e.g. about 3, 4, 5, 6, 7, 8, 9, 10, 15, 20 or 25 nm. The layer of silver salt formed on the surface of the precursor nanoparticles may be about 1 to about 10 nm in thickness, or about 1 to 5, 1 to 2, 2 to 10, 5 to 10, 2 to 8 or 2 to 5 nm, e.g. about 1, 2, 3, 4, 5, 6, 7, 8, 9 or 10 nm.

The precursor nanoparticles used in the process may consist essentially of metallic gold. They may have a purity of at least about 90% pure (on a mole basis) or at least about 95, 99, 99.5 or 99.9%. Alternatively they may comprise a gold alloy or some other gold-containing mixture. Suitable gold precursor nanoparticles for use in the process may be made by reducing an Au(III) salt with a reducing agent so as to form the precursor nanoparticles. This may be conducted in an aqueous medium, in which case the reducing agent should be a water compatible reducing agent such as borohydride. In this case also, the Au(III) salt should be water soluble. It may for example be $AuCl_3$. A stabilising agent for the gold precursor nanoparticles may also be present. Suitable stabilising agents include citrate, PVP (polyvinylpyrrolidone) or surfactants. Suitable surfactants may be non-ionic surfactants such as Triton X-100 (t-octylphenoxypolyethoxyethanol). Stabilisers in general stabilise the nanoparticles by adsorbing on the surface so as to prevent or inhibit aggregation of the nanoparticles by electrostatic interaction. In the event that the gold precursor nanoparticles are produced in an aqueous medium, the process may also comprise the step of transferring the gold precursor nanoparticles into an organic solvent prior to the step of forming the layer of the silver salt on the gold. The transfer may involve mixing the aqueous mixture containing the gold precursor nanoparticles with a water-miscible organic solvent containing a transfer agent. The transfer agent may comprise an alkyl amine. The water-miscible organic solvent may suitably be a short chain alcohol such as ethanol or methanol, or other polar solvent such as acetone. The alkyl amine may be a long chain alkyl amine. It may be a primary amine. The alkyl group on the amine may be about C6 to about C20, or about C6 to C12, C12 to C20, C12 to C16, C8 to C14 or C10 to C14, e.g. C6, C7, C8, C9, C10, C11, C12, C13, C14, C15, C16, C17, C18, C19 or C20. The alkyl group may be straight chain. It may be saturated. It may be unsaturated. It may comprise one or more double and/or triple bonds (i.e. it may be an alkenyl or alkynyl or alkenynyl group). It may be a mixture of such alkyl amines. The amine may be a secondary or tertiary amine, or may be a quaternary ammonium salt. The amine (or ammonium salt) should have an amine group which is capable of binding to (or associating with) the nanoparticle, and a non-polar tail which facilitates dispersion of the particle in a non-polar solvent. Thus the alkyl groups on a secondary or tertiary amine or an ammonium salt may each, independently, be as described above. A mixture of the amines and/or ammonium salts described above may be used. An alternative transfer agent comprises dipotassium bis(p-sulfonatophenyl)phenylphosphane dehydrate (BSPP). Extraction of the resulting aqueous/organic mixture with a suitable organic extractant transfers the gold precursor nanoparticles to the organic extractant. The organic extractant may be a low polarity or non-polar organic solvent. It may be an aromatic solvent such as benzene, toluene, xylene etc. It may be a mixture of solvents comprising one or more of these.

Instead of gold precursor nanoparticles as described above, core-shell precursor nanoparticles in which the shell comprises gold may be used. In this option, the precursor nanoparticles each comprise a core having the gold on a surface thereof. Thus the core may comprise a material that is not gold. It may for example comprise platinum or palladium or a mixture of these. A suitable process for making the cores comprises reducing a salt or complex of a metal. As noted above, a suitable metal for the core is platinum. In this case, the precursor to the metal cores may be $Pt(acac)_2$. This may be reduced to nanoparticulate platinum metal in the form of nanosized cores by heating in the presence of an amine (optionally in the absence of further solvent. Commonly a trace amount of a silver salt is added in order to produce the desired spherical cores. Suitable amines are as described above in the synthesis of the gold precursor nanoparticles. The reaction is preferably conducted under an inert atmosphere, e.g. helium, neon, argon, nitrogen or a mixture of these. Suitable temperatures are about 120 to 200° C., or about 140 to 200, 160 to 200, 120 to 160 or 140 to 180° C., e.g. about 120, 130, 140, 150, 160, 170, 180, 190 or 200° C. After the cores have been formed, a shell of gold may be then deposited on the surfaces of the cores in order to form the core-shell precursor nanoparticles. This may be performed without separation or purification of the cores. Thus in the example of platinum described above, the platinum cores in amine may be treated with a gold compound so as to form a gold shell on the cores, thereby forming the core-shell precursor nanoparticles Pt@Au. The amine may be sufficient to convert (reduce) the gold compound to metallic gold (Au(0)). The gold compound may be a gold salt, such as a gold (III) salt, for example $AuCl_3$ or $AuBr_3$. Suitably the reaction is conducted under an inert atmosphere as described above for formation of the core. A suitable reaction temperature for deposition of gold on the core to form a shell is about 80 to 120° C., or about 80 to 100, 100 to 120 or 90 to 110° C., e.g. about 80, 85, 90, 95, 100, 105, 110, 115 or 120° C. Thus following the formation of the cores, the reaction mixture may be cooled to the desired shell formation temperature while maintaining the same atmosphere over the mixture, and the gold compound added. Once formed, the core-shell precursor nanoparticles may be purified. This may for example comprise one or more of precipitating, washing, centrifuging or other suitable techniques. They may then be suspended in an organic solvent for subsequent elaboration. The organic solvent may be a low polarity or non-polar organic solvent. It may be an aromatic solvent such as benzene, toluene, xylene etc. It may be a mixture of solvents comprising one or more of these.

The process may then comprise forming a layer of a silver salt on the surface of the precursor nanoparticles. This may comprise converting the silver ions in solution to a form in which they are substantially insoluble in the reaction medium (which is commonly an organic solvent such as toluene). Thus it may comprise forming a layer of an insoluble silver salt on the surface of the precursor nanoparticles, where the insoluble silver salt is insoluble in the reaction medium. It may comprise precipitating a layer of the insoluble silver salt on the surface of the precursor nanoparticles. In an exemplified embodiment the silver salt is silver sulfide. The step of forming the layer of the silver sulfide may comprise exposing the precursor nanoparticles to Ag(I) and elemental sulfur. This is conveniently conducted in an organic solvent, such as the low polarity solvent described above. It may be necessary to transfer the precursor nanoparticles into the organic solvent, as described above. In this case it is also necessary to provide the Ag(I) in an organic solvent (optionally the same organic solvent in which the precursor nanoparticles are provided). This may be accomplished in a similar manner as described above for transfer of the gold precursor nanoparticles into an organic solvent. Thus aqueous Ag(I) may be mixed with a water miscible organic solvent (e.g. ethanol) and an amine (as described previously). The resulting solution can then be extracted with an organic extractant so as to provide a solution of Ag(I) in the extractant (i.e. an organic Ag(I) solution). The organic extractant should preferably be the same as, or at least miscible with, the organic solvent in which the gold precursor nanoparticles are provided. Combination of the gold precursor nanoparticles in the organic solvent with the organic Ag(I) solution, and treatment of the resulting mixture with elemental sulfur results in conversion of the Ag(I) to $Ag_2S$, which forms as a layer on the precursor nanoparticles so as to generate the coated nanoparticles. It is thought that amine present as a result of transfer of the Ag(I) and/or the gold precursor nanoparticles into organic media may reduce, or catalyse the reduction of, the elemental sulfur to $S^{2-}$, which can then combine with the Ag(I) ions to form $Ag_2S$. The reaction is preferably conducted with vigorous agitation in order to ensure exposure of all reagents to each other and to prevent agglomeration which would inhibit the layer formation. The layer formation may be conducted at room temperature, or at some other suitable temperature, e.g. about 0 to about 100° C., or about 0 to 50, 0 to 25, 0 to 10, 10 to 100, 20 to 100, 50 to 100, 15 to 50, 15 to 30 or 20 to 25° C., e.g. about 0, 5, 10, 15, 20, 25, 30, 35, 40, 45, 50, 55, 60, 65, 70, 75, 80, 85, 90, 95 or 100° C. It may take about 2 to about 12 hours, or about 2 to 8, 2 to 4, 4 to 12, 6 to 12 or 6 to 10 hours, e.g. about 2, 3, 4, 5, 6, 7, 8, 9, 10, 11 or 12 hours, depending in part on the temperature and in part on the thickness of the layer formed.

As described earlier, aging of the resulting coated nanoparticles can allow metallic gold to diffuse or migrate through the silver compound so as to form the nanocomposite particles. The step of aging may simply comprise maintaining the coated nanoparticles in a solvent for sufficient time for the gold of each coated nanoparticle to diffuse through layer of the silver salt to the surface of said coated nanoparticle. This may take between about 6 and about 48 hours, or between about 6 and 24, 6 and 12, 12 and 48, 24 and 48, 12 and 36 or 18 and 30 hours, e.g. about 6, 12, 18, 24, 30, 36, 42 or 48 hours. The time may depend on the thickness of the layer of silver compound over the gold in the coated nanoparticles, and may also depend on the temperature of the aging. The aging may be conducted at room temperature, or at some other suitable temperature, e.g. about 0 to about 100° C., or about 0 to 50, 0 to 25, 0 to 10, 10 to 100, 20 to 100, 50 to 100, 15 to 50, 15 to 30 or 20 to 25° C., e.g. about 0, 5, 10, 15, 20, 25, 30, 35, 40, 45, 50, 55, 60, 65, 70, 75, 80, 85, 90, 95 or 100° C.

A second process for making the nanocomposite particles involves direct precipitation of metallic gold onto nanoparticles having a silver salt on their surface. Again, a suitable silver salt is silver sulfide. The nanoparticles may be made by reacting an Ag(I) salt with elemental sulfur so as to form the nanoparticles. The process for making the $Ag_2S$ nanoparticles may be similar to the process described above for deposition of a layer of silver sulfide on the surface of gold precursor nanoparticles, however with the omission in this case of the gold precursor nanoparticles. Thus aqueous Ag(I) having a water miscible organic solvent and an amine is extracted into an organic extractant, and the resulting organic Ag(I) solution is treated with elemental sulfur. Conditions are as described elsewhere herein. The nanoparticles may comprise or consist essentially of the silver salt. Alternatively they may comprise a core that is not the silver salt, with a shell of the silver salt surrounding the core. It should be noted that deposition of a layer of silver sulfide on the surface of platinum cores (similar to the deposition of gold on such cores as described earlier) could not be achieved by reaction of sulfur with silver (I) in the presence of platinum cores.

The deposition of metallic gold on the nanoparticles having a silver salt surface may comprise exposing the nanoparticles to a solution of Au(III) in the presence of an amine. As for previous reactions this is preferably conducted in an organic medium. Thus Au(III) could be transferred into an organic extractant in the same manner as described earlier for transfer of Ag(I) and of gold precursor nanoparticles. Simply combining the organic Au(III) solution and the nanoparticles in an organic solvent leads to formation of metallic gold on the nanoparticle surfaces, leading directly to the nanocomposite particles. It is thought that the amine (described in detail earlier) is sufficient to reduce Au(III) to Au(0), or to catalyse that reduction, so as to form the metallic gold on the nanoparticle surfaces. The reaction may be conducted at room temperature, or at some other suitable temperature, e.g. about 0 to about 100° C., or about 0 to 50, 0 to 25, 0 to 10, 10 to 100, 20 to 100, 50 to 100, 15 to 50, 15 to 30 or 20 to 25° C., e.g. about 0, 5, 10, 15, 20, 25, 30, 35, 40, 45, 50, 55, 60, 65, 70, 75, 80, 85, 90, 95 or 100° C. It may take about 0.5 to about 2 hours, or about 0.5 to 1, 1 to 2 or 0.7 to 1.5 hours, e.g. about 30 or 45 minutes, or about 1, 1.25, 1.5, 1.75 or 2 hours. The time may depend in part on the temperature used. It is thought that the silver salt on the surface of the nanoparticles may catalyse the amine reduction of the gold (III) so as to form the gold preferentially on the nanoparticle surfaces.

The nanocomposite materials described herein may find applications as a catalyst, or for making optical or electronic devices.

The nanocomposite materials have been tested as catalysts in three-component coupling reactions, and displayed excellent catalytic activity. A representative reaction is shown below:

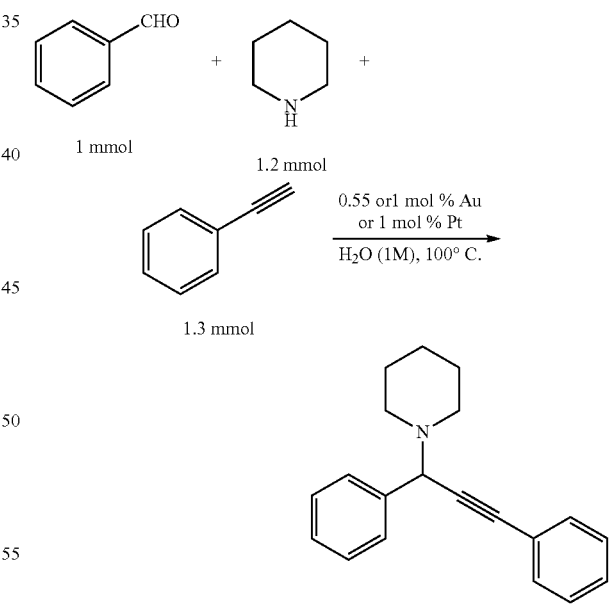

Also, the $Ag_2S$ shell may be used to modulate the optical properties of nanoparticulate gold. Thus the nanocomposite material described herein may be used in optical or electronic devices.

The present invention also provides a process for producing nanoparticles of a silver compound. In particular, the process provides a suspension or dispersion of the silver compound in an organic medium. In the process, an aqueous solution comprising a silver salt and an alkyl amine is extracted with an organic solvent so as to transfer the silver salt to the organic solvent. The resulting organic solution contains silver ions which are then precipitated in the organic solution as nanoparticles of the silver compound.

The aqueous solution may comprise an alcohol or some other water-miscible organic solvent, e.g. a water miscible alcohol. Suitable examples include methanol, ethanol, propanol, isopropanol, acetone and tetrahydrofuran. A solution of the silver salt in water may therefore be combined with the alkyl amine and the alcohol to provide the aqueous solution used in the process.

The alkyl amine may be a primary alkyl amine. It may be a long chain alkyl amine. It may be a C8 to C18 alkyl amine e.g. dodecylamine or a mixture of C8 to C18 alkyl amines. Suitable amines are the same as those used in transferring gold particles into organic media, and have been described earlier in this specification.

The silver salt may be any water soluble silver salt. It may be a silver (I) salt. It may be silver nitrate, or it may be silver fluoride or it may be silver acetate or it may be a mixture of soluble silver salts.

The organic solvent may have low miscibility with water. It may be a hydrocarbon solvent. It may be an aromatic solvent. It may for example be benzene, toluene or xylene. It may be a mixture of any two or more of these, or it may be a mixture of any one of these with some other solvent, e.g. with one or more other solvents having low water miscibility. Transfer of silver ions from aqueous to organic media may be facilitated by the presence of the alkyl amine. Thus the amine may associate with the silver ions, and the hydrophobic tail of the amine may facilitate transfer of the resulting silver ion-amine association to the organic solvent. The presence of an organic solvent such as an alcohol in the aqueous solution may facilitate the dissolution of the amine (or of the amine-silver ion association) in the aqueous solution prior to the extraction. The transfer of silver from aqueous to organic media may be efficient. It may be at least about 90% efficient, or at least about 95, 96, 97, 98 or 99% efficient. It will be apparent that the above process may be conveniently used for transfer from aqueous to organic media of species that are capable of associating with, or forming a complex with, an amine. In the present specification the examples of transfer of silver ions and of gold nanoparticles are presented, however other species may also be transferred at room temperature using an analogous protocol. Thus the extraction step described above results in an organic solution of a silver salt, in particular of a water soluble silver salt. The silver in said organic solution may be associated with the amine.

The proportions of water, water miscible organic solvent and organic solvent with low miscibility with water should be such that during the extraction step of the above process, an aqueous phase and a non-aqueous phase separate, wherein the non-aqueous phase contains the majority of the silver ions.

The silver compound formed from the silver ions in the organic solvent may be silver sulfide or it may be some other silver salt (e.g. silver (I) salt) which is substantially insoluble in the organic solvent (optionally also substantially insoluble in water). The silver compound may be formed by combination of the silver ions in the organic solvent with a suitable counterion which converts the silver ions to an insoluble silver compound. In the event that the silver compound is silver sulfide, the step of precipitation may comprise exposing the organic solution to elemental sulfur. It is thought that this reaction proceeds by way of reduction of the sulfur to sulfide ions, which can then condense with the silver ions to form silver sulfide nanoparticles. The reduction may involve reaction with, or catalysis by, the amine.

The silver compound may precipitate as a suspension or a dispersion. Thus the particles of the silver compound that are produced by the process may have a mean diameter of about 3 to about 25 nm or about 3 to 15, 3 to 10, 3 to 5, 5 to 25, 5 to 20, 5 to 15, 10 to 25, 15 to 25 or 10 to 20 nm, e.g. about 3, 4, 5, 6, 7, 8, 9, 10, 15, 20 or 25 nm.

The process may be conducted at room temperature. It may be conducted at about 15 to about 25° C., or about 15 to 20, 20 to 25 or 18 to 23° C., e.g. about 15, 16, 17, 18, 19, 20, 21, 22, 23, 24 or 25° C. In some cases it may be conducted at some other temperature.

The invention also provides a suspension or dispersion of nanoparticles of a silver compound in an organic solvent. The suspension or dispersion may be made by the process described above. The silver compound and the organic solvent may be as described above. The suspension or dispersion may be stable. It may be stable for at least about 1 day, or at least about 2, 3, 4, 5, 6, 7, 8, 9, 10, 11, 12, 13 or 14 days. It may be stable in that the particles do not settle over that period of time.

In particular embodiments the present describes a room-temperature approach to synthesize $Ag_2S$ nanocrystals (nanoparticles) in toluene. The protocol involved firstly transferring Ag(I) ions from aqueous solution into toluene using a method mediated by ethanol and dodecylamine, and then reacting with elemental sulfur in toluene at room temperature to form the $Ag_2S$ nanocrystals. Next, nanocomposites were formed between gold and $Ag_2S$ through the heterogeneous deposition of gold on the $Ag_2S$ nanocrystals or by the homogeneous growth of $Ag_2S$ on Au nanocrystals. The latter approach produced $Ag_2S$—Au shell-core structures, which induced a red-shift of the surface plasmon resonance (SPR) of gold nanocrystals. To generate the gold seeds (cores), dipotassium bis(p-sulfonatophenyl)phenylphosphane dehydrate (BSPP) was used to transfer Au nanocrystals of >10 nm from water to toluene. The present approach allows for the synthesis of $Ag_2S$ nanocrystals with a narrow size distribution at room temperature. The protocol used to transfer Ag(I) ions from water to toluene may be extended to synthesize $Ag_2S$ and gold nanocomposites, including the heterogeneous deposition of gold on $Ag_2S$ nanocrystals and the homogeneous growth of $Ag_2S$ on gold nanocrystals. The latter produced $Ag_2S$—Au shell-core structures.

This technology provides a simple and convenient route to prepare $Ag_2S$ nanocrystals and their nanocomposites with gold. The resulting materials are of interest for optical, electronic, energy, catalytic and biological applications.

The present disclosure also describes the diffusion of gold through $Ag_2S$ from the core of core shell nanoparticles to the surface, giving rise to novel $Ag_2S$—Au heterodimers (nanocomposites). This phenomenon may be used to synthesize complex semiconductor—metal nanocomposites which might not be obtainable by direct synthesis. Specifically, the synthesis of heterogeneous nanocomposites of core-shell Pt@$Ag_2S$ and of Au nanoparticles based on the diffusion of Au in $Ag_2S$ in core-shell-shell Pt@Au@$Ag_2S$ nanoparticles is described.

In this synthesis, gold diffused from the core of nanoparticles to the surface, giving rise to $Ag_2S$—Au heterodimers. This reverse diffusion of Au may also be used to synthesize complex semiconductor—metal nanocomposites that might not be achievable by direct synthesis.

This diffusion process provides a new strategy for synthesizing semiconductor—metal hybrids or for metal doping in semiconductor nanocrystals. The resulting materials are of interest for optical, electronic, electrochemical, energy, catalytic and biological applications.

EXAMPLE 1

Room-Temperature Synthesis of Nanocrystalline Silver Sulfide and its Nanocomposites with Gold The present disclosure describes nanocomposites formed between gold and $Ag_2S$ by the heterogeneous deposition of gold on $Ag_2S$ nanocrystals, and by the homogeneous growth of $Ag_2S$ on gold nanocrystals. The latter produced shell-core $Ag_2S$—Au nanostructures, which induced the red-shift of the surface plasmon resonance (SPR) of Au nanocrystals.

In the experiments of this example, all the reactions were performed in toluene. To synthesize the semiconductor component ($Ag_2S$) of the nanocomposite, the inventors have developed a facile room-temperature approach that involved the transfer of Ag(I) ions from water to toluene using a method mediated by ethanol and dodecylamine, and reaction with elemental sulfur in toluene. The ethanol-mediated method was also used to transfer Au(III) ions and gold nanocrystals from water to toluene for the formation of nanocomposites.

Figure 5:
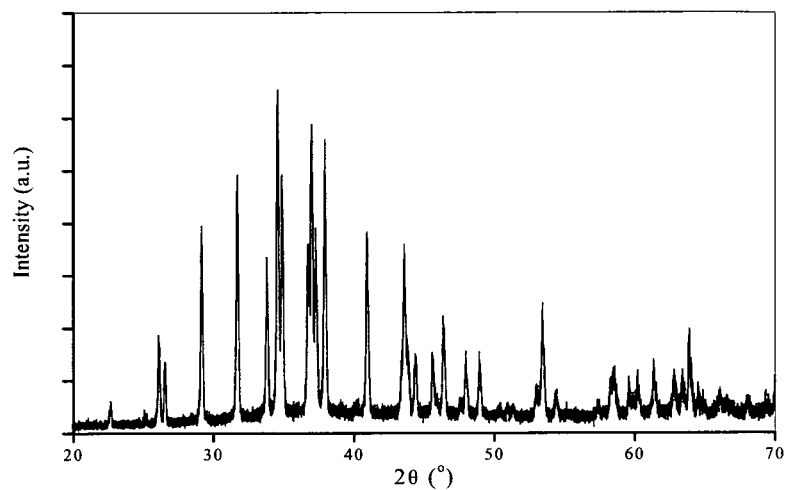
FIG. 5 shows an XRD pattern of the as-prepared $Ag_2S$ nanocrystals.

Transmission electron microscopy (TEM) showed that the silver sulfide nanocrystals were spherical and monodispersed with an average size of about 15 nm (FIG. 1a). Interestingly, these nanocrystals have a strong tendency to form self-assembled hexagonal suprastructures. It was feasible to obtain one- and two-layered close-packed superlattices of the nanocrystals on TEM grids (FIGS. 1a and b). This room-temperature approach and the self-assembly tendency of the resulting nanostructures are considered to be useful for fabricating novel suprastructures for chemical, optical, magnetic, and electronic nanodevices. The high-resolution TEM (HRTEM) image illustrated the lattice planes in these nanocrystals, confirming that these particles were of high crystallinity (FIG. 1c). The selected area electron diffraction (SAED) pattern showed diffraction rings, which could be indexed to monoclinic $Ag_2S$ (FIG. 1d), in agreement with the sample's X-ray diffraction (XRD) pattern (FIG. 5).

Figure 2:
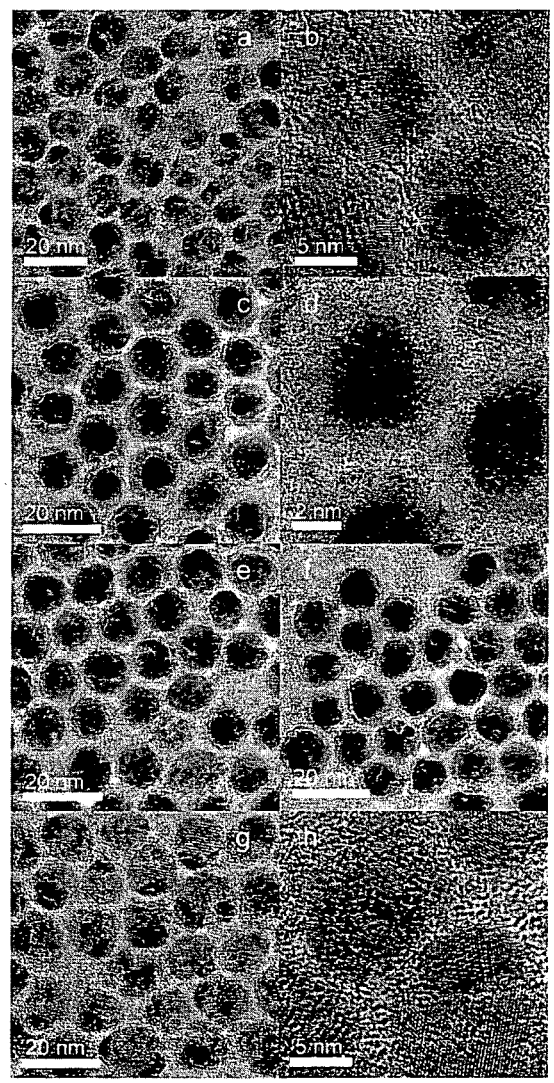
FIG. 2 shows (a) TEM and (b) HRTEM images of $Au/Ag_2S$ heterogeneous nanostructures, (c) TEM and (d) HRTEM images of $Ag_2S$—Au shell-core nanoparticles ($Ag_2S$:Au molar ratio=2:1), (e, f) TEM images of $Ag_2S$—Au shell-core nanoparticles ($Ag_2S$:Au molar ratios of 1:2 and 1:1, respectively), (g) TEM and (h) HRTEM images of $Ag_2S$—Au shell-core nanoparticles ($Ag_2S$:Au molar ratio=2:1) after 108 h of aging.

After aging the mixture of $Ag_2S$ and $HAuCl_4$ in toluene for 1 h, Au/$Ag_2S$ heterodimers were found as the dominant product. No additional reducing agent was needed. Dodecylamine was able to reduce the Au(III) ions sufficiently in the presence of $Ag_2S$ nanocrystals. Isolated Au nanocrystals were not observed. This suggested that noble metal nucleated preferentially on the existing $Ag_2S$ nanocrystals, instead of homogeneously, under the experimental conditions. It was noteworthy that in the absence of $Ag_2S$ nanocrystals, the reduction of Au(III) ions by dodecylamine would require several days. This suggested that the reduction process was catalyzed in the presence of the $Ag_2S$ semiconductor. Since gold has strong imaging contrast, the heterogeneous Au/$Ag_2S$ hybrids could be easily identified (FIG. 2a). In most cases, Au was deposited only at a single site on each $Ag_2S$ nanocrystal. The diameter of the deposited gold nanocrystals was about 3 nm. Energy dispersive X-ray (EDX) analysis and X-ray photoelectron spectroscopy (XPS) (FIGS. 7 and 8) confirmed the heterogeneous structure was composed of $Ag_2S$ and Au. Also, HRTEM image revealed that the crystal planes of Au were not parallel to those of $Ag_2S$ in each heterodimer nanoparticle (FIG. 2b). The angles between the two nanocrystals varied from one hybrid particle to another, indicating that the growth of gold took place in different orientations. This result was similar to the report on CdSe—Au nanocomposite, but different from that on a peanut-shaped PbS—Au nanocomposite whereby the (200) crystal plane of PbS was parallel to the (111) crystal plane of gold.

When the order of nanocrystal synthesis was reversed, i.e. generating $Ag_2S$ nanocrystals in the presence of Au nanocrystals, $Ag_2S$ grew homogeneously on the existing Au nanocrystals, resulting in $Ag_2S$—Au shell-core structure (FIG. 2c, $Ag_2S$:Au=2:1). Additional structural details are revealed by the HRTEM image in FIG. 2d. As in the case of Au/$Ag_2S$ heterodimers, the crystal planes of the Au cores were not parallel to those of the $Ag_2S$ shell in $Ag_2S$—Au nanoparticles.

The thickness of the $Ag_2S$ shell could be controlled by varying the $Ag_2S$:Au molar ratio in the synthesis. FIGS. 2e and f illustrate the $Ag_2S$—Au shell-core nanocrystals synthesized at $Ag_2S$:Au molar ratios of 1:2 and 1:1. The thickness of $Ag_2S$ shell could be varied as shown by comparing FIGS. 2c, e and f.

Figure 3:
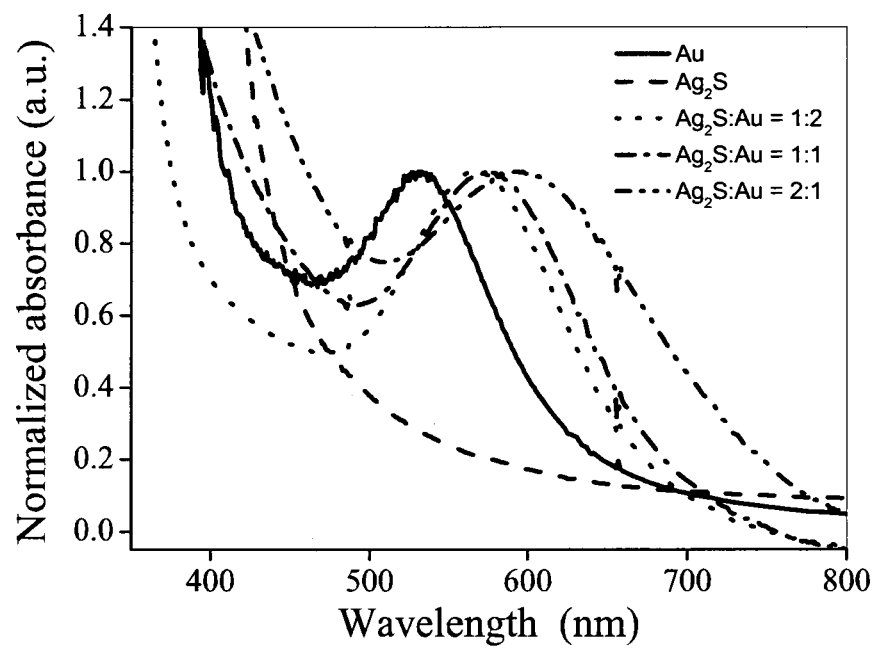
FIG. 3 shows UV-visible spectra of $Ag_2S$, Au, and core-shell Au@$Ag_2S$ nanocrystals with different molar ratio of $Ag_2S$ to Au.

$Ag_2S$—Au shell-core nanoparticles retained the optical properties of Au nanocrystals despite the presence of the $Ag_2S$ shell (see FIG. 3). The absorption peaks at 567 nm, 576 nm and 593 nm were attributed to the surface plasmon resonance (SPR) of gold cores. The large red-shift of the gold surface plasmon band in these shell-core nanoparticles relative to the pure gold nanocrystals could be attributed to the presence of the $Ag_2S$ shell. In addition, the SPR peak of the gold cores could be tuned by the thickness of the $Ag_2S$ shell.

An interesting phenomenon was noted in the $Ag_2S$—Au nanoparticles whereby gold would diffuse from the core of the particle to the surface, giving rise to Au/$Ag_2S$ heterodimers. FIGS. 2g and h illustrate that the $Ag_2S$—Au shell-core nanoparticles ($Ag_2S$:Au molar ratio=2:1) have become Au/$Ag_2S$ heterodimers after 108 h of aging at room temperature. This phenomenon is explored further in Example 2.

Figure 4:
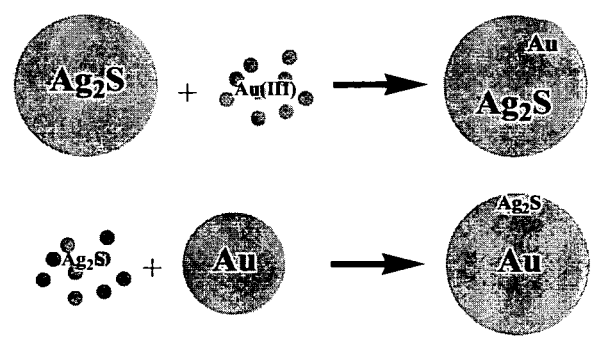
FIG. 4 is a diagrammatic representation of the formation of silver sulfide/gold nanocomposites.

In summary, the inventors have demonstrated a room-temperature synthesis for $Ag_2S$ nanocrystals and their nanocompsites with gold. Gold could be deposited only at a single site on each $Ag_2S$ seed nanocrystal. In contrast, $Ag_2S$ could grow homogeneously on Au seed nanocrystals, resulting in shell-core $Ag_2S$—Au nanoparticles, which still possessed the optical properties of Au nanocrystals. This facile synthesis could be employed towards fabricating a variety of nanocomposites with interesting structures and tailored functionalities. The formation of the nanocomposites is illustrated in FIG. 4.

EXPERIMENTAL

All reagents used were purchased from Sigma-Aldrich.

Phase Transfer of Noble Metal Ions from Water to Toluene

In a typical experiment, 50 mL of 1 mM of aqueous metal salt solution ($AgNO_3$ or $HAuCl_4$) were mixed with 50 mL of ethanol containing 1 mL of dodecylamine. After 3 min of stirring, 50 mL of toluene was added, and stirred for another minute. Phase transfer of metal ions from water to toluene occurred rapidly and completely, as illustrated by the complete bleaching of the colour in the aqueous phase. The metal ion concentration in toluene assuming complete transfer of the ions from water was 1 mM. The metal ions in toluene were separated from the aqueous phase and kept for further experiments. Inductively coupled plasma-atomic emission spectrophotometry (ICP-AES) showed that the transfer efficiencies for Ag(I) and Au(III) ions were >98%.

Synthesis of $Ag_2S$ Nanocrystals 3 mg of elemental sulfur were added to 20 mL of toluene solution of Ag(I) ions in a 50-mL flat-bottom flask. The mixture was stirred for 3 h at room temperature. The solution turned from colorless to dark brown, indicating the formation of $Ag_2S$ nanoparticles. The XRD peaks of the as-prepared $Ag_2S$ nanocrystals (FIG. 5) could be indexed to the monoclinic $Ag_2S$ phase.

Figure 6:
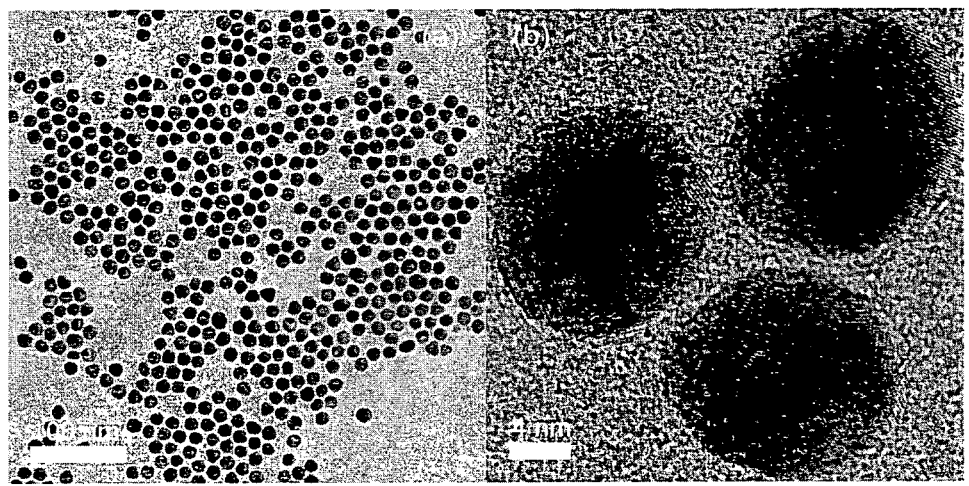
FIG. 6 shows (a) TEM (bar=50 nm) and (b) HRTEM (bar=2 nm) images of 13-nm Au nanoparticles transferred from water to toluene.

Synthesis and Phase Transfer of 13-nm Au Nanoparticles 13-nm citrate-stabilized Au nanoparticles were prepared according to an established procedure ((a) Grabar, K. C.; Freeman, R. G.; Hommer, M. B.; Natan, M. *J. Anal. Chem.* 1995, 67, 735-743. (b) Gearheart, L. A.; Ploehn, H. J.; Murphy, C. J. *J. Phys. Chem. B* 2001, 105, 12609-12615). A stirred aqueous solution of $HAuCl_4$ (1 mM, 20 mL) was refluxed in a silicon oil bath at 110° C. 2 mL of 40 mM of aqueous tri-sodium citrate solution were added quickly, which resulted in a series of colour changes before turning red. The mixture was refluxed for another 15 min, and allowed to cool to room temperature. For the phase transfer of gold nanoparticles larger than 10 nm, 50 mg of solid dipotassium bis(p-sulfonatophenyl)phenylphosphane dehydrate (BSPP) were added to the gold hydrosol, and the mixture was aged for 30 mM. Next, gold nanoparticles were transferred from water to toluene following the approach used for the phase transfer of Ag(I) and Au(III) ions. Typically, the BSPP-stabilized Au hydrosol was mixed with 20 mL of ethanol containing 0.4 mL of dodecylamine. After 3 mM of stirring, 20 mL of toluene were added and stirred for another minute. ICP-AES analysis showed that this phase transfer efficiency was about 100%. The TEM and HRTEM images of Au nanoparticles after phase transfer are shown in FIG. 6.

Synthesis of Heterogeneous $Au/Ag_2S$ Hybrids

Figure 7:
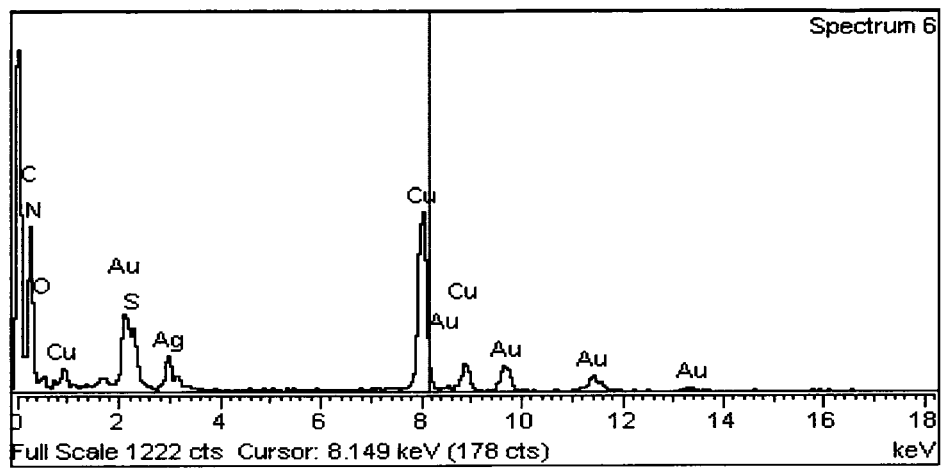
FIG. 7 shows EDX analysis of the Au/$Ag_2S$ heterodimers.
Figure 8:
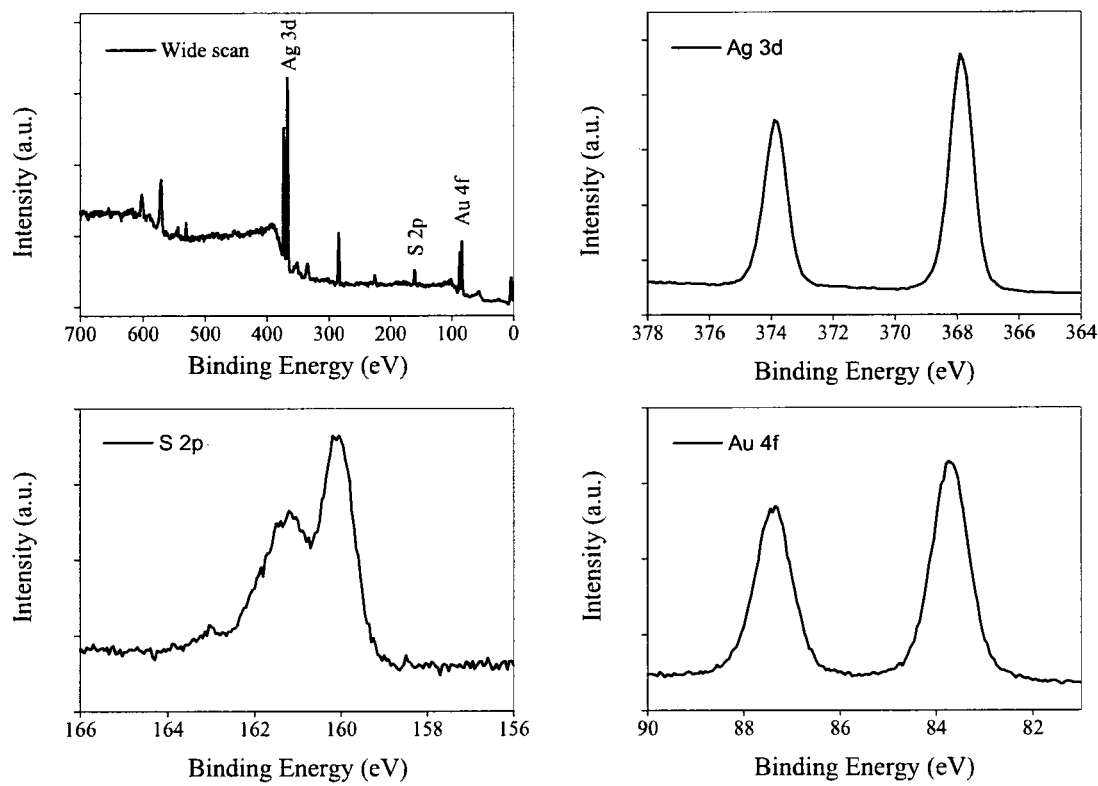
FIG. 8 shows XPS spectra of the Au/$Ag_2S$ heterodimers.

For the preparation of $Au/Ag_2S$ heterodimers, 10 mL of $Ag_2S$ organosol in toluene were mixed with 10 mL of Au(III) solution in toluene. The mixture was aged for 1 h to complete the reaction. Additional reducing agent was not required: dodecylamine was able to reduce Au(III) ions in toluene effectively in the presence of $Ag_2S$. The EDX analysis and XPS of the $Au/Ag_2S$ heterodimers are shown in FIG. 7 and FIG. 8, respectively.

Synthesis of Shell-Core $Ag_2S$—Au Nanoparticles 10 mL of Ag(I) ions in toluene and 10 mL of 13-nm gold organosol in toluene were mixed. Next, 2 mg of elemental sulfur were added under vigorous stirring; stirring was continued for another 8 hours. The $Ag_2S$:Au molar ratio was controlled by mixing different volumes of Ag(I) ions and Au organosol in toluene.

EXAMPLE 2

Synthesis of Complex Semiconductor—Metal Nanocomposites Based on the Diffusion of Au in $Ag_2S$ Nanocrystals from Core to Surface In this study, gold diffused from the core of the nanoparticles to the surface, giving rise to $Ag_2S$—Au heterodimers. This reverse diffusion of gold not only has scientific significance, but also could be used to synthesize complex semiconductor—metal nanocomposites, which might not be obtainable by direct synthesis. Specifically, this example details the synthesis of heterogeneous nanocomposites of core-shell $Pt@Ag_2S$ and gold nanoparticles based on the diffusion of gold in $Ag_2S$ nanocrystals. Ostwald ripening was observed during the characterization of the nanocomposites with transmission electron microscopy (TEM). This elucidated the mechanism of formation of semiconductor—metal heterostructures as a consequence of gold diffusion in $Ag_2S$ nanocrystals.

Figure 9:
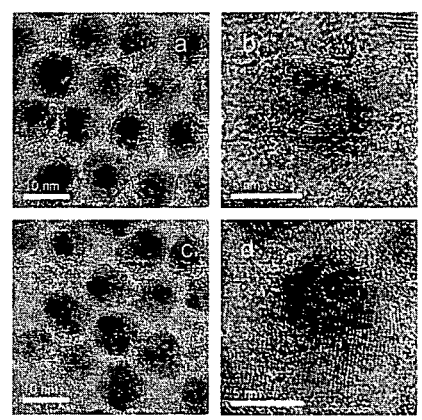
FIG. 9 illustrates diffusion of Au from the core to the surface of core-shell Au@$Ag_2S$ nanocrystals. (a,c) TEM and (b,d) HRTEM images of Au@$Ag_2S$ nanocrystals (a,b) before and (c,d) after 72 h of aging.

The synthesis of core-shell $Au@Ag_2S$ nanocrystals followed a seed-mediated growth method. TEM and high-resolution TEM (HRTEM) images of the as-prepared core-shell $Au@Ag_2S$ nanoparticles are shown in FIGS. 9(*a*) and (*b*), respectively, whereby the core and shell components can be easily differentiated by brightness contrast. The diffusion of Au in $Ag_2S$ from core to surface was completed after 72 h of aging (FIGS. 9(*c*) and (*d*)). The resulting $Ag_2S$—Au heterodimers were clearly distinct from the starting core-shell $Au@Ag_2S$ nanocrystals.

The driving force for the diffusion of Au in $Ag_2S$ from core to surface could be similar to that underlying the Kirkendall effect, which has been used in the past to form hollow particles. Due to the relatively high surface-to-volume ratio, the diffusion of Au in core-shell $Au@Ag_2S$ nanocrystals from core to surface could be achieved so that the system decreased its chemical potential and reduced its Gibbs free energy.

Figure 10:
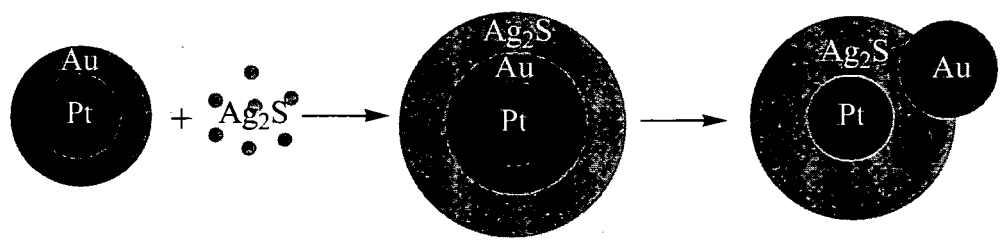
FIG. 10 is a schematic of the synthesis of semiconductor—metal nanocomposite based on the diffusion of Au in $Ag_2S$.
Figure 11:
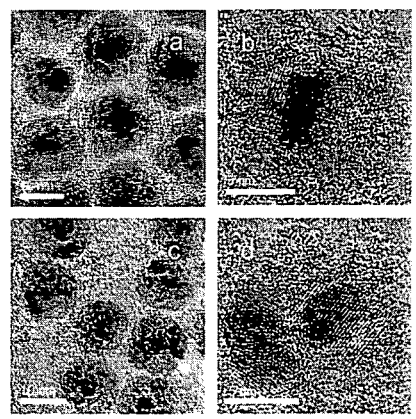
FIG. 11 shows (a,c) TEM and (b,d) HRTEM images of (a,b) core-shell-shell Pt@Au@$Ag_2S$ nanoparticles, and (c,d) the resulting Pt@$Ag_2S$—Au nanocomposites obtained from the diffusion of Au in $Ag_2S$ to the surface.
Figure 16:
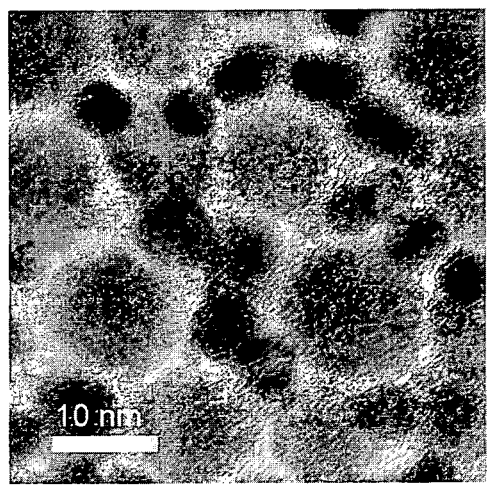
FIG. 16 shows a TEM image of $Ag_2S$ nanocrystals (in grey tone) synthesized in the presence of Pt seeds (in a darker shade). $Ag_2S$ does not grow on the existing Pt seeds, but form separate particles in the colloid instead.

This diffusion phenomenon could be adopted to synthesize more complex semiconductor—metal nanocomposites. Core-shell Pt@Au nanoparticles were prepared using seed-mediated growth method, and next coated with $Ag_2S$ (see FIG. 10). Gold then diffused to the surface of $Ag_2S$, resulting in a heterogeneous hybrid of core-shell $Pt@Ag_2S$ and Au nanoparticles, labeled as $Pt@Ag_2S$—Au (see FIG. 11). It should be noted that core-shell $Pt@Ag_2S$ nanoparticles could not be synthesized directly; $Ag_2S$ nanocrystals were formed independently in solution in the presence of Pt seeds (FIG. 16).

Figure 17:
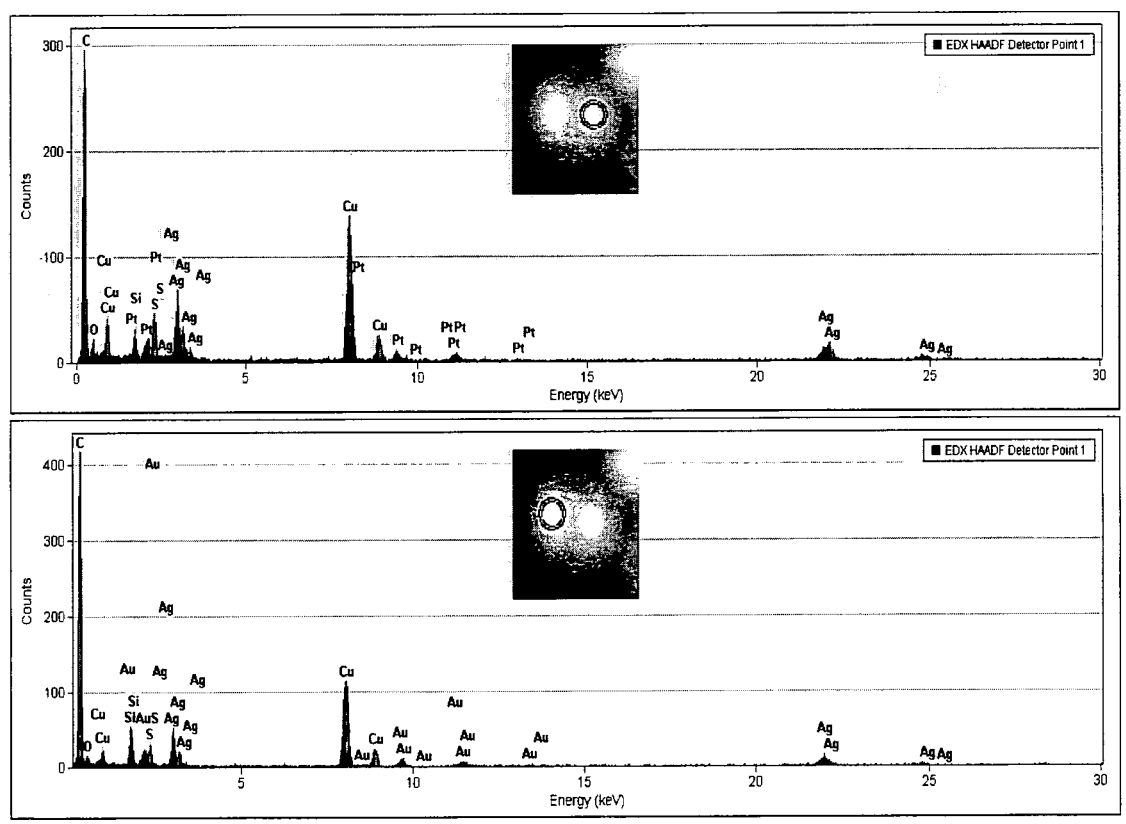
FIG. 17 shows STEM analyses showing the confinement of Pt and Au in the core and on the surface, respectively, of Pt@$Ag_2S$—Au nanocomposite.

TEM and HRTEM images of core-shell-shell $Pt@Au@Ag_2S$ are shown in FIGS. 11*a* and 11*b* respectively. After 24 hours aging, metallic gold separates from the platinum core and diffuses to the surface of the $Ag_2S$ shell, resulting in the formation of $Pt@Ag_2S$—Au nanocomposite particles. Brightness contrast in the TEM image (FIG. 11*c*) shows three different domains in each nanocomposite and HRTEM image (FIG. 11*d*) further reveals that the lattice orientation of the dark patch on the surface of nanocomposites is different from that located at the core location. Analytical scanning TEM (STEM) studies (FIG. 17) show the confinement of each component in different regions, confirming that the dark patches on the surface and those in the core location are composed of gold and platinum, respectively.

Figure 12:
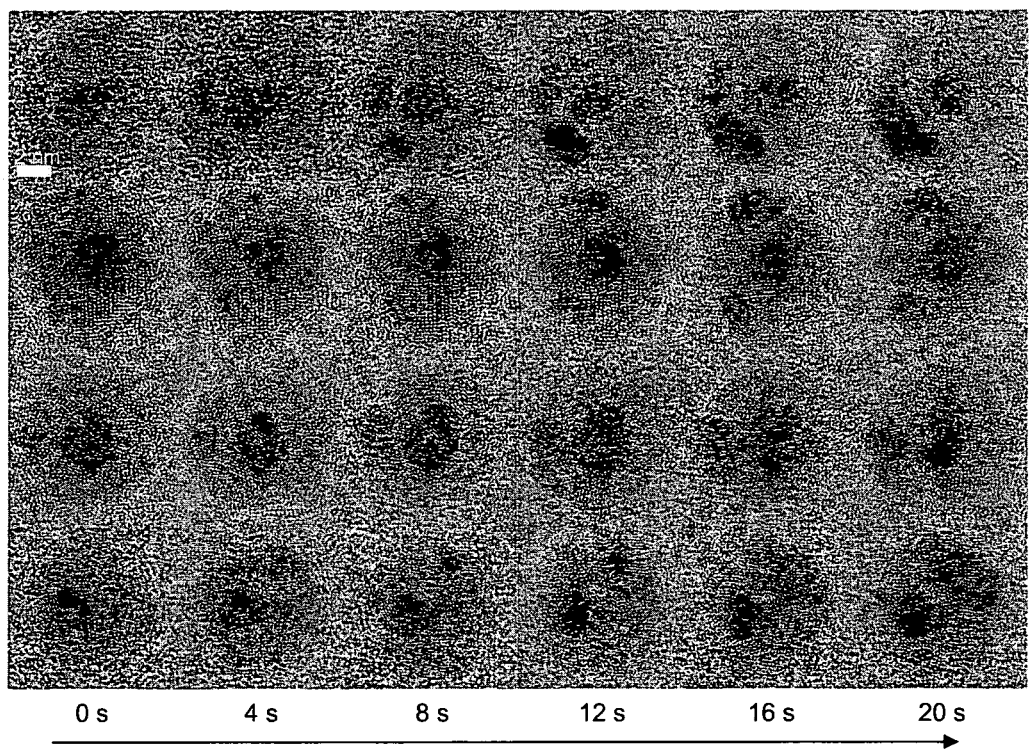
FIG. 12 illustrates Ostwald ripening observed during the diffusion of Au in $Ag_2S$. Initially, Au diffuses homogeneously in $Ag_2S$ in all directions, but then evolves as growing nanocrystals on the $Ag_2S$ surface due to Ostwald ripening.

Ostwald ripening was observed during the characterization of the heterostructured nanocomposites. Ostwald ripening is a phenomenon whereby particles larger than a critical size grow at the expense of smaller particles due to their relative stabilization by the surface energy term. FIG. 12 shows the TEM images of four nanocomposites captured over a period of 20 s. Evolution of gold patches or regions on the surface of the nanocomposites was clearly observed. The ripening observed in TEM might not exactly represent the case in solution since the electron beam might have affected the process. However, this observation suggested a reason why the diffusion process did not lead to a homogeneous distribution of gold on the particle surface. Initially, gold atoms might have diffused in all directions within $Ag_2S$. However, nanoparticles of gold were then formed on the $Ag_2S$ surface and grew steadily due to Ostwald ripening.

In summary, the diffusion of gold in $Ag_2S$ from core to surface is reported. In the first stage, gold atoms may diffuse uniformly in $Ag_2S$ from core to surface. Gold regions would then evolve on the surface of Ag$_2$S due to Ostwald ripening. As an application of this diffusion phenomenon, a complex nanocomposite of core-shell Pt@Ag$_2$S and gold is synthesized. This diffusion process provides a new strategy for the synthesis of semiconductor—metal hybrids and for the metal doping in semiconductor nanocrystals.

EXPERIMENTAL

General

All reagents used were purchased from Sigma-Aldrich.

Phase Transfer of Ag(I) Ions from Water to Toluene

In a typical experiment, 50 ml of aqueous AgNO$_3$ solution (1 mM) were mixed with 50 ml of ethanol containing 1 ml of dodecylamine. After 3 min of stirring, 50 mL of toluene were added, and stirred for another minute. The Ag(I) ion concentration in toluene assuming complete transfer of the ions from water was 1 mM. The Ag(I) ions in toluene were separated from the aqueous phase, and kept for further experiments. Inductively coupled plasma-atomic emission spectrophotometry (ICP-AES) showed that the transfer efficiencies for Ag(I) ions were greater than 99%.

Figure 13:
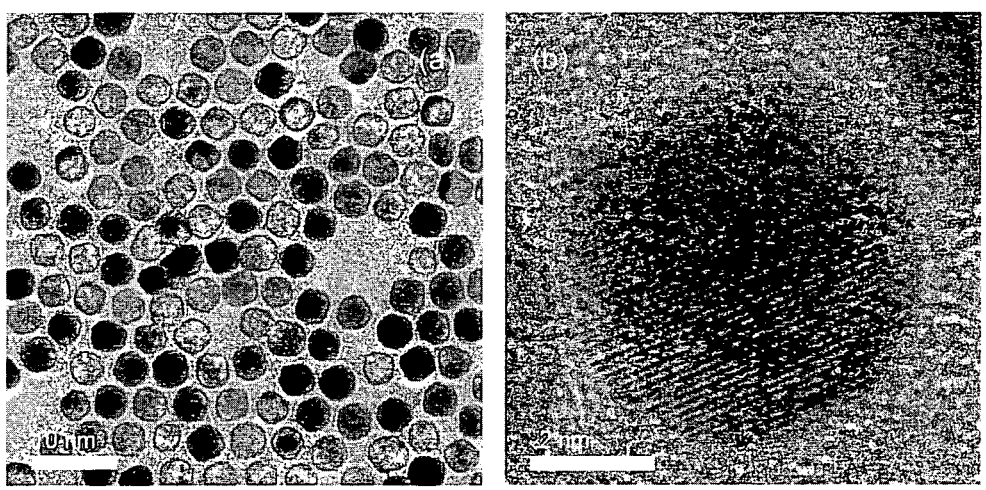
FIG. 13 shows (a) TEM and (b) HRTEM images of 5-nm Au seeds transferred from water to toluene.

Synthesis and Phase Transfer of 5-nm Au Seed Nanoparticles 5-nm citrate-protected Au nanoparticles were prepared by the NaBH$_4$ reduction of HAuCl$_4$. First, 20 ml of aqueous HAuCl$_4$ solution (1 mM) were mixed with 1.6 ml of aqueous sodium citrate solution (40 mM). Next, 0.5 ml of aqueous NaBH$_4$ solution (100 mM) was added dropwise under vigorous stirring, giving rise to a red Au hydrosol. The gold hydrosol was used after aging for 24 h to decompose the residual NaBH$_4$. Gold nanoparticles were transferred from water to toluene following the approach used for the phase transfer of Ag(I) ions. Typically, the citrate-stabilized gold hydrosol was mixed with 20 ml of ethanol containing 0.4 ml of dodecylamine. After 3 min of stirring, 20 ml of toluene were added and stirred for another minute. ICP-AES analysis showed that the phase transfer efficiency was about 100%. The TEM and HRTEM images of gold nanoparticles after phase transfer are shown in FIG. 13.

Synthesis of Core-Shell Au@Ag$_2$S Nanocrystals and the Diffusion of Gold in Ag$_2$S 10 ml of Ag(I) ions in toluene were mixed with 4 ml of 5-nm gold organosol in toluene. Next, 2 mg of elemental sulfur were added under vigorous stirring; stirring was continued for another 8 h. The core-shell Au@Ag$_2$S organosol in toluene was then aged for 72 h to complete the diffusion of gold in Ag$_2$S from core to surface.

Figure 14:
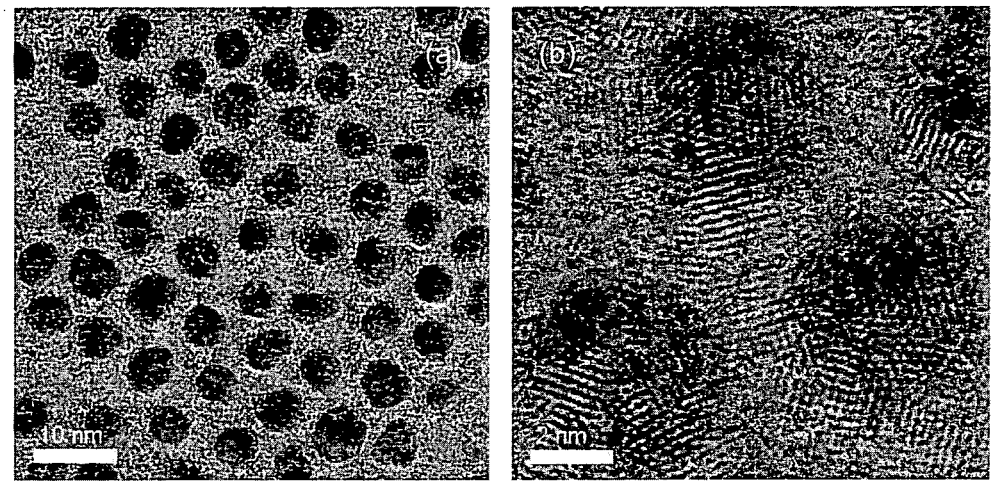
FIG. 14 shows (a) TEM and (b) HRTEM images of 4-nm Pt nanoparticles synthesized in oleylamine.

Synthesis of 4-Nm Pt Seeds and Core-Shell Pt@Au Nanoparticles 60 mg of Pt(acac)$_2$ and 5 mg of AgNO$_3$ were added to 20 ml of oleylamine. The trace of silver was used to form spherical platinum seeds. In the absence of silver, platinum nanotetrapods would be obtained instead. The mixture was heated at 160° C. for 3 h under flowing argon and stirring. 10 ml of the platinum seeds (cores) in oleylamine were then purified by precipitating with methanol, centrifuging, washing with methanol, and re-dispersion in 10 ml of toluene. TEM and HRTEM images of the platinum seeds are shown in FIG. 14.

Figure 15:
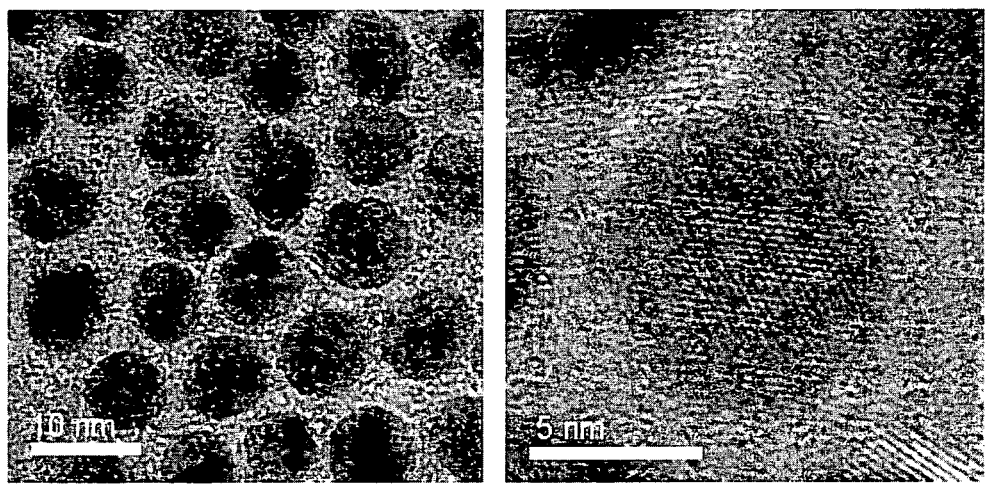
FIG. 15 shows (a) TEM and (b) HRTEM images of core-shell Pt@Au nanoparticles synthesized in oleylamine by seed-mediated growth method.

The other 10 ml of platinum seeds in oleylamine were then lowered in temperature to 100° C., and 100 mg of AuCl$_3$ were added. Stirring was continued for another 2 h under flowing argon at 100° C. to completely reduce Au(III) to Au(0) in the presence of platinum seeds. The resulting core-shell Pt@Au nanoparticles were purified by precipitating with methanol, centrifuging, washing with methanol, and re-dispersion in 10 ml of toluene. TEM and HRTEM images of the core-shell Pt@Au nanoparticles are shown in FIG. 15.

Synthesis of Core-Shell-Shell Pt@Au@Ag$_2$S Nanoparticles and the Diffusion of Au from Core to Surface 5 ml of Ag(I) ions in toluene were mixed with 40 µl of core-shell Pt@Au organosol in toluene. Next, 2 mg of elemental sulfur were added under vigorous stirring; stirring was continued for another 8 h. The core-shell-shell Pt@Au@Ag$_2$S organosol in toluene was then aged for 24 h to complete the diffusion of gold in Ag$_2$S from core to surface.

Synthesis of Ag$_2$S Nanocrystals in the Presence of 4-nm Platinum Seeds 5 ml of Ag(I) ions in toluene and 40 µl of platinum organosol in toluene were mixed. Next, 2 mg of elemental sulfur were added under vigorous stirring; stirring was continued for another 8 h. TEM did not show the formation of core-shell Pt@Ag$_2$S nanocrystals (FIG. 16). Ag$_2$S would not grow on the existing Pt seeds, but formed separate nanoparticles in the colloid instead.

The invention claimed is:

1. A nanocomposite particle comprising:
   a nanoparticle having a surface comprising a silver salt, and
   at least one region of metallic gold on said surface,
   wherein the region(s) of metallic gold are approximately circular.

2. The nanocomposite particle of claim 1, wherein the nanoparticle consists essentially of the silver salt.

3. The nanocomposite particle of claim 1, wherein the nanoparticle has a core-shell structure, wherein the shell consists essentially of the silver salt.

4. The nanocomposite particle claim 1, wherein the silver salt is silver sulfide.

5. The nanocomposite particle of claim 1, wherein the nanoparticle is substantially spherical.

6. A process for making a nanocomposite material, said process comprising:
   providing a plurality of precursor nanoparticles, each having a surface comprising metallic gold;
   forming a layer of a silver salt on the gold thereby forming coated nanoparticles; and
   aging the coated nanoparticles so as to allow the gold of each coated nanoparticle to at least partially diffuse through the layer of the silver salt to the surface of said coated nanoparticle so as to form at least one region of metallic gold on said surface.

7. The process of claim 6, wherein the precursor nanoparticles consist essentially of metallic gold.

8. The process of claim 7, wherein the step of providing the precursor nanoparticles comprises exposing an Au(III) salt to a reducing agent so as to form the precursor nanoparticles.

9. The process of claim 6, wherein the precursor nanoparticles each comprise a core having the gold on a surface thereof, said core comprising a material that is not gold.

10. The process of claim 9, wherein the cores comprise metallic platinum.

11. The process of claim 6, wherein the silver salt is silver sulfide.

12. The process of claim 11, wherein the step of forming the layer of the silver sulfide comprises exposing the precursor nanoparticles to Ag(I) and elemental sulfur.

13. The process of claim 6, wherein the step of aging comprises maintaining the coated nanoparticles in a solvent for sufficient time for the gold of each coated nanoparticle to diffuse through layer of the silver salt to the surface of said coated nanoparticle.

14. A process for making a nanocomposite material, said process comprising:
   providing a plurality of nanoparticles, each having a surface comprising a silver salt; and
   depositing metallic gold on the surfaces of said nanoparticles, wherein said depositing comprises exposing the nanoparticles to a solution of Au(III) in the presence of an amine.

15. The process of claim 14, wherein the silver salt is silver sulfide.

16. The process of claim 15, wherein the step of providing the nanoparticles comprises reacting an Ag(I) salt with elemental sulfur so as to form the nanoparticles.

17. The process of claim 14, wherein the step of providing the plurality of nanoparticles comprises:
   providing an aqueous solution comprising a silver salt and an alkyl amine;
   extracting the silver salt into an organic solvent to form an organic solution comprising silver ions; and
   precipitation of the silver ions in the organic solution as nanoparticles of the silver compound.

18. The process of claim 17, wherein the step of providing the aqueous solution comprises combining a solution of the silver salt in water with a solution of the alkyl amine in an alcohol.

19. The process of claim 17, wherein the alkyl amine is a C8 to C18 alkyl amine or a mixture of C8 to C18 alkyl amines.

20. The process of claim 17, wherein the silver salt is silver nitrate.

21. The process claim 17, wherein the silver compound is silver sulfide.

* * * * *

UNITED STATES PATENT AND TRADEMARK OFFICE
CERTIFICATE OF CORRECTION

PATENT NO. : 8,632,884 B2
APPLICATION NO. : 13/057395
DATED : January 21, 2014
INVENTOR(S) : Jackie Y. Ying and Jun Yang Page 1 of 1

It is certified that error appears in the above-identified patent and that said Letters Patent is hereby corrected as shown below:

In the Claims

Column 20, line 20, after "The process", insert --of--.

Signed and Sealed this
Twenty-eighth Day of October, 2014

Michelle K. Lee
*Deputy Director of the United States Patent and Trademark Office*